US008703509B2

(12) United States Patent
Abo et al.

(10) Patent No.: US 8,703,509 B2
(45) Date of Patent: Apr. 22, 2014

(54) METHOD FOR MANUFACTURING A SUBSTRATE FOR LIQUID-EJECTING HEADS AND A LIQUID-EJECTING HEAD

(75) Inventors: Hiroyuki Abo, Tokyo (JP); Keiji Watanabe, Kawasaki (JP); Keiji Matsumoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 16 days.

(21) Appl. No.: 12/973,708

(22) Filed: Dec. 20, 2010

(65) Prior Publication Data

US 2011/0151598 A1 Jun. 23, 2011

(30) Foreign Application Priority Data

Dec. 22, 2009 (JP) ................................ 2009-291022

(51) Int. Cl.
*H01L 21/311* (2006.01)
*H01L 21/302* (2006.01)

(52) U.S. Cl.
USPC .............. 438/21; 438/700; 438/750; 438/753

(58) Field of Classification Search
USPC ........... 438/21, 689, 694, 700, 706, 745, 749, 438/750, 753; 347/54, 56, 63, 65, 67; 216/2, 27; 257/E21.214, E21.222, 257/E21.219, E21.223, E21.246
See application file for complete search history.

(56) References Cited

U.S. PATENT DOCUMENTS

| | | | | |
|---|---|---|---|---|
| 6,245,245 | B1 * | 6/2001 | Sato | 216/27 |
| 7,323,115 | B2 | 1/2008 | Hayakawa et al. | |
| 2003/0058309 | A1 * | 3/2003 | Haluzak et al. | 347/65 |

* cited by examiner

*Primary Examiner* — Colleen Matthews
*Assistant Examiner* — Quovaunda V Jefferson
(74) *Attorney, Agent, or Firm* — Canon USA, Inc. IP Division

(57) ABSTRACT

A method for manufacturing a substrate for liquid-ejecting heads includes etching a surface of a silicon substrate using a first etchant, with a silicon oxide layer as a mask, to form a depression as a part of a liquid supply port, and subsequently etching at least the silicon oxide layer and the thickness sandwiched between the depression and the etched surface of the silicon substrate with a second etchant to form the liquid supply port.

16 Claims, 5 Drawing Sheets

METHOD FOR MANUFACTURING A SUBSTRATE FOR LIQUID-EJECTING HEADS AND A LIQUID-EJECTING HEAD

BACKGROUND OF THE INVENTION

1. Field of the Invention

The present invention relates to a method for manufacturing a substrate for liquid-ejecting heads and a liquid-ejecting head.

2. Description of the Related Art

For silicon substrates, etching using a basic aqueous solution such as tetramethylammonium hydroxide (TMAH) solution may proceed at different rates depending on the orientation, and this allows for anisotropic etching of silicon substrates. Liquid-ejecting heads, represented by inkjet recording heads, usually have a silicon oxide layer formed on the silicon substrate, and this silicon oxide layer is insusceptible to etching. With this layer as a mask, silicon substrates undergo anisotropic etching to obtain a supply port for ink or some other kind of liquid.

Some patent publications have disclosed methods for manufacturing a liquid-ejecting head in which a liquid supply port is formed by this technique, namely, anisotropic etching.

FIGS. 5A to 5C illustrate an example of such methods, the method disclosed in U.S. Pat. No. 7,323,115. A silicon substrate 101 has energy-generating elements 102 arranged on either surface, and the opposite surface is covered with a silicon oxide layer, which serves as an etching mask 103, and a protection layer 104 for the etching mask 103 as illustrated in FIG. 5A. Then, as illustrated in FIG. 5B, the silicon substrate 101 undergoes anisotropic etching using TMAH solution to obtain a liquid supply port 106. During this step, the silicon substrate 101 is etched not only in the thickness direction but also in the horizontal direction, or in the direction perpendicular to the thickness direction, and thus the edge around the opening of the etching mask 103 is left protruding as a burr 105. This burr 105 may snap during mounting or assembly of the liquid-ejecting head and enter the liquid flowing from the supply port to ejection ports. So, this burr 105 is usually removed by etching using a mixed solution of hydrofluoric acid, ammonium fluoride, and other necessary components as illustrated in FIG. 5C.

Methods like this one, in which a burr left as a part of an etching mask is removed using a mixed solution containing hydrofluoric acid and ammonium fluoride, require making the burr easy to remove by asking of the inside of the supply port or some other surface treatment for improved wettability. And, there has been increasing demand for closer contact between a liquid-ejecting head and a substrate supporting it. This demand would be satisfied by forming a liquid supply port and then removing the silicon oxide layer and its protection layer to expose the back surface of the silicon substrate; however, this step may be burdensome to manufacturers.

SUMMARY OF THE INVENTION

The manufacturing method for a substrate for liquid-ejecting heads according to the present invention includes preparing a substrate to have a first surface and a second surface opposite to the first surface, the first surface having an energy-generating element formed thereon, and the second surface covered with a silicon oxide layer having an opening, etching a portion of the substrate using a first etchant, with a silicon oxide layer as a mask, to form a depression on the second surface, the first etchant offering a lower etching rate on silicon oxide surfaces than on silicon surfaces, and etching at least the silicon oxide layer and a portion sandwiched between the depression and the first surface using a second etchant to form a liquid supply port, the second etchant offering a higher etching rate on silicon oxide surfaces than that offered by the first etchant.

Further features of the present invention will become apparent from the following description of exemplary embodiments with reference to the attached drawings.

DESCRIPTION OF THE EMBODIMENTS

Figure 1A:
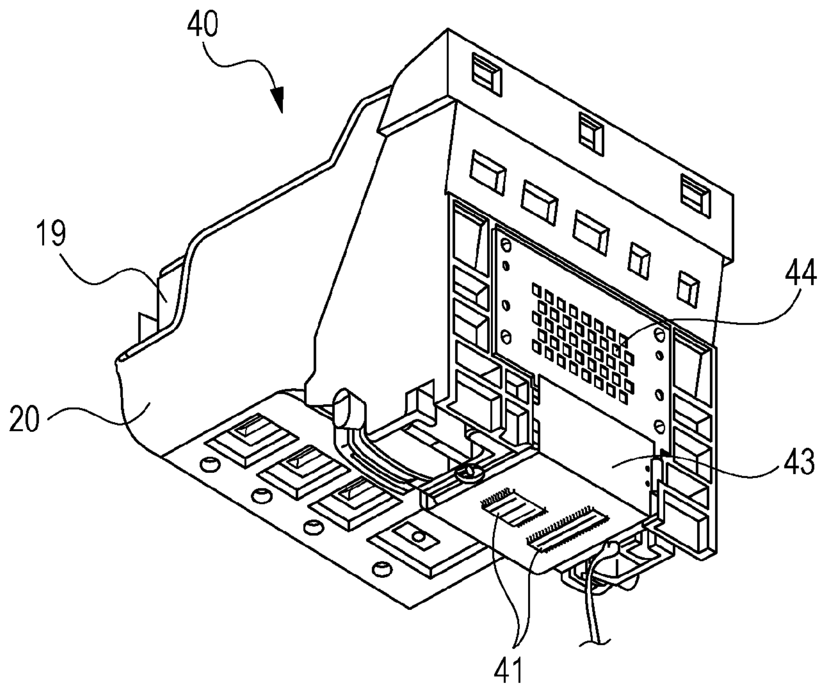
FIG. 1A is a perspective view of a liquid supply unit that accommodates a liquid-ejecting head.

FIG. 1A is a perspective view of a liquid supply unit 40, and this liquid supply unit 40 can be installed in a liquid-utilizing recording apparatus. Several liquid-ejecting heads 41 (hereinafter, sometimes simply referred to as heads) communicate with a contact pad 44 via a flexible film-printed circuit substrate 43. The contact pad 44 is connected to the recording apparatus, and the flexible film-printed circuit substrate 43 is connected to terminals 17. The heads 41 are cemented to a supporting substrate so that they can be held on the liquid supply unit 40. The liquid supply unit 40 has a reservoir holder 20, which accommodates a reservoir 19. The reservoir 19 contains a liquid, and this liquid is supplied to the heads 41.

Figure 1B:
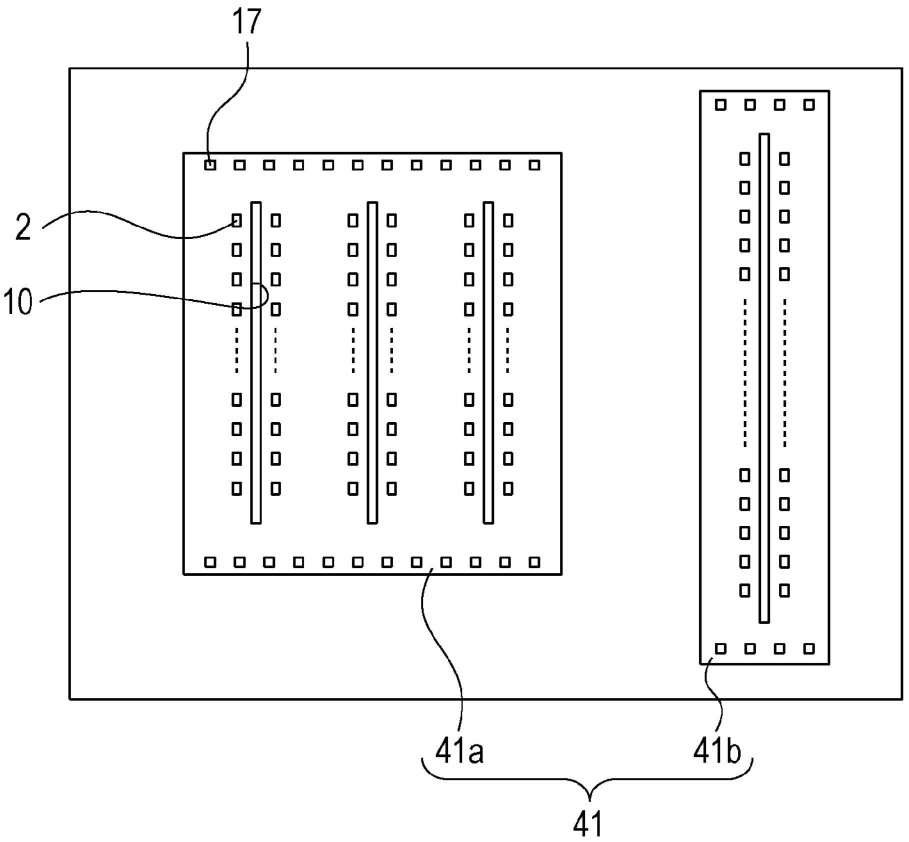
FIG. 1B is an exemplary schematic diagram illustrating a liquid-ejecting head unit.

FIG. 1B is an exemplary schematic diagram illustrating the heads 41 installed. As can be seen from the drawing, the heads 41 may be arranged for ejection of several kinds of liquids (first liquid-ejecting heads 41*a*) or a single kind of liquid (second liquid-ejecting heads 41*b*), and a single liquid supply unit 40 may hold several liquid-ejecting heads 41.

Figure 2A:
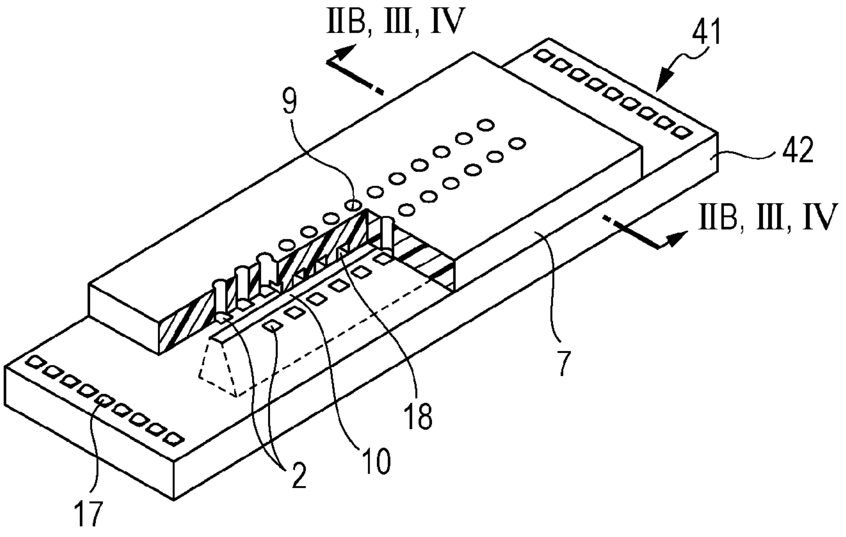
FIG. 2A is a perspective view of a liquid-ejecting head according to the present invention.

FIG. 2A is a perspective view of a single liquid-ejecting head 41. The liquid-ejecting head 41 is composed of a substrate (hereinafter, a liquid-ejecting head substrate 42 or a substrate 42) and a wall member 7, which can be defined as a member serving as walls surrounding liquid flow passages, formed on the substrate 42. The substrate 42 has energy-generating elements 2, and the wall member 7 has ejection ports 9. The ejection ports 9 are arranged in two lines with a predetermined interval and eject a liquid carried thereto by the energy generated by the energy-generating elements 2. Additionally, the substrate 42 has a liquid supply port 10. The liquid supply port 10 extends between the two lines of the ejection ports 9 and supplies the liquid to the ejection ports 9. Furthermore, the substrate 42 has several terminals 17 arranged on one of its surfaces, or the first surface. These terminals 17 supply power and signals to the energy-generating elements 2 to drive them.

Figure 2B:
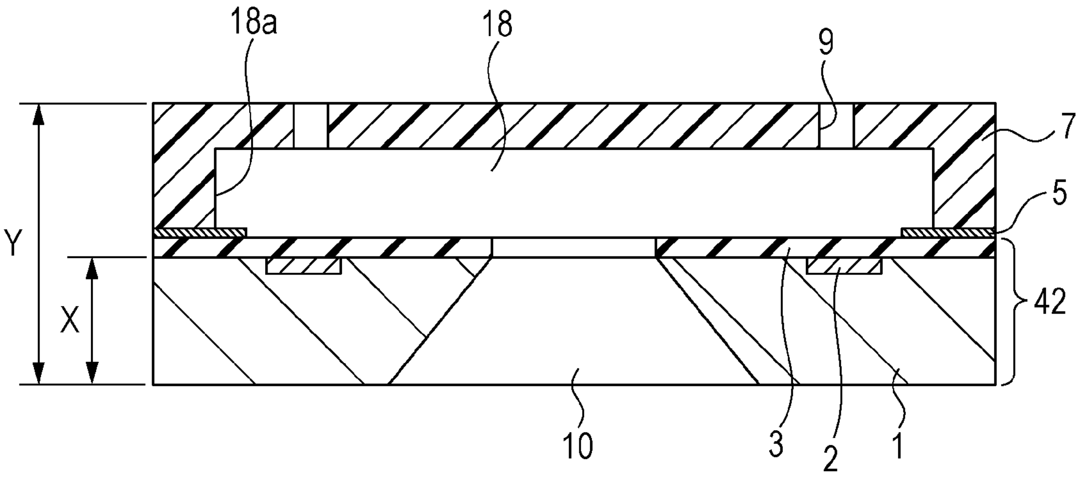
FIG. 2B is a cross-sectional view of the same liquid-ejecting head.

FIG. 2B is a cross-sectional view taken along line IIB-IIB of FIG. 2A (in FIG. 2A, this line is also indicated as III-III or IV-IV). A silicon substrate 1, having the energy-generating elements 2 arranged on the first surface, is covered with an insulating layer 3. The insulating layer 3 not only insulates the energy-generating elements 2 but also protects them. In the present invention, a substrate having this constitution is referred to as a liquid-ejecting head substrate 42.

The wall member 7 is constituted by the ejection ports 9 formed thereon and a wall 18*a*. The wall 18*a* defines with its inner surface a flow passage 18, which communicates with each ejection port 9. With this wall 18*a* inside, the wall member 7 is brought into contact with the substrate 42, and this constitution allows the flow passage 18 to function as a passage. Additionally, a contact-improving layer 5 may be inserted between the wall member 7 and the substrate 42; the contact-improving layer 5 can be defined as a layer used to improve the contact between the wall member 7 and the substrate 42.

The liquid is supplied from the reservoir 19, carried via the liquid supply port 10 to the flow passage 18, comes into film boiling utilizing energy generated by the energy-generating elements 2, and then is ejected from the ejection ports 9 onto a recording medium. This is the way of recording with this unit.

In FIG. 2B, the liquid-ejecting head has no silicon oxide burr around the opening of the liquid supply port 10. This prevents the ejection ports 9 from clogging due to burr fragments.

Note that in this specification, the term "liquid-utilizing recording apparatus" includes devices such as printers, photocopiers, facsimiles, and word processors, industrial recorders made as combinations of these devices and processing units, and so forth. Used in combination with a liquid-ejecting head, the recording apparatus puts some information on paper, string, fiber, cloth, leather, metal, plastic, glass, wood, ceramic, and many other kinds of recording media. The term "recording" refers not only to putting letters, figures, and other kinds of images making sense on a recording medium but also to putting patterns and other kinds of images making no sense on a recording medium.

Also, the term "liquid" should be understood in a broad sense; it refers to all kinds of liquids that can be applied onto a recording medium to form images, designs, patterns, and so forth, to process the recording medium, or to treat ink or the recording medium. Processing of ink or a recording medium means, for example, that the coloring material contained in ink and applied onto a recording medium is coagulated or insolubilized for improved fixation, improved quality of images or color reproduction, improved durability of images, and other purposes.

Manufacturing Method

FIGS. 3A to 4D are cross-sectional diagrams illustrating a manufacturing method for the liquid-ejecting head illustrated in FIG. 2A, taken along line IIB-IIB (in FIG. 2A, this line is also indicated as III-III or IV-IV).

A silicon substrate 1*a* is prepared in advance to have two opposing surfaces: The first surface has several energy-generating elements 2 formed thereon and is covered with an insulating layer 3, whereas the second is covered with a silicon oxide layer 11. The insulating layer 3 can be made from silicon oxide (SiO) or silicon nitride (SiN). The silicon oxide layer 11 can be prepared by partial oxidization of the silicon substrate 1*a* or sputtering.

Recall that for silicon substrates, etching using a basic aqueous solution may proceed at different rates depending on the orientation, more specifically, the etching rate is lower on the (111) plane than on the (111) plane, and this allows for anisotropic etching of silicon substrates. In the present invention, the second surface of the silicon substrate 1*a* is a (100) plane so that a liquid supply port 10 can be formed through the silicon substrate 1*a*.

Figure 3A:
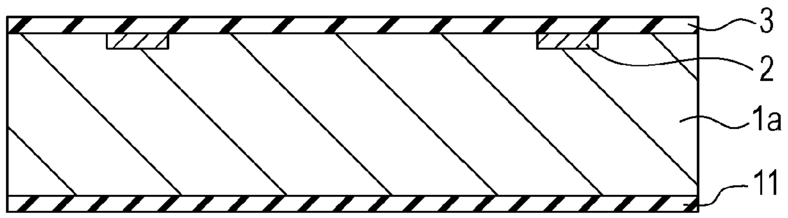
FIGS. 3A to 3D are cross-sectional diagrams illustrating steps in a manufacturing method for a liquid-ejecting head according to the present invention.
Figure 3B:
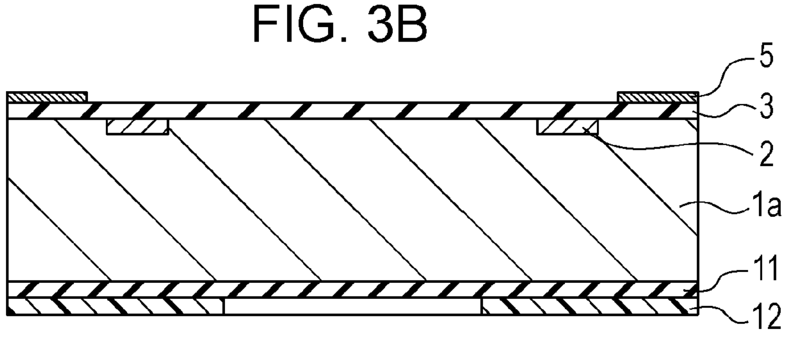

As illustrated in FIG. 3B, a contact-improving layer 5 is formed on the insulating layer 3, and an etching mask 12 is formed on the silicon oxide layer 11. These layer and mask can be made from thermoplastic resin and completed by photolithography or etching. The contact-improving layer 5 and the etching mask 12 may be made from different materials; however, using the same material for both reduces the manufacturing cost. More specifically, a polyether amide film ensures close contact for the wall member 7 and the liquid-ejecting head substrate 42 and also has the capability of serving as an etching mask.

Figure 3C:
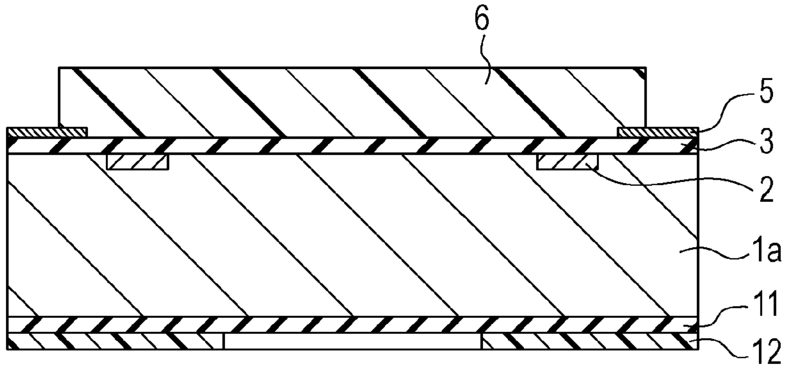

Then, as illustrated in FIG. 3C, a soluble, photosensitive resin material is applied onto the insulating layer 3 by spin coating, roller coating, or some other similar application method and then photolithographically shaped into a mold 6. The mold 6 should occupy the volume to be spared for a flow passage 18. Any material may be used to form the mold 6 as long as it hardly swells in the solvent contained in the material of the wall member 7 (to be formed on the mold 6 later) and can be easily dissolved when necessary. A specific example of the material for the mold 6 is polymethyl isopropenyl ketone, a photosensitive resin.

Figure 3D:
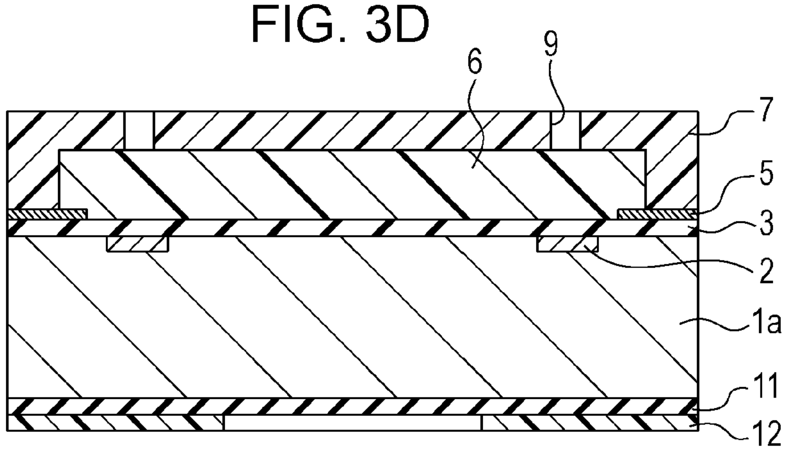

Then, a photosensitive resin material for the wall member 7 is applied to cover the contact-improving layer 5 and the mold 6 by spin coating, roller coating, or some other similar application method, and the obtained layer is photographically patterned to have several ejection ports 9, as illustrated in FIG. 3D. This photosensitive resin material should ensure that the resultant layer hardly swells in liquid, strongly adheres to the insulating layer 3, resists external impact, and has photosensitivity of a degree high enough to allow for creation of the ejection ports 9 accurately in position. Specific examples of this photosensitive resin material include photosensitive epoxy resin materials. In addition, the wall member 7 may be coated with a water-repellent material by, for example, lamination with a dry film.

Figure 4A:
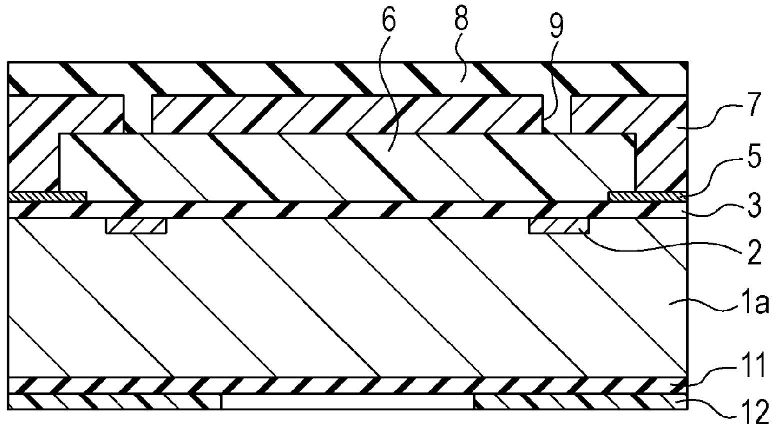
FIGS. 4A to 4D are further cross-sectional diagrams illustrating steps in the same manufacturing method.

Then, as illustrated in FIG. 4A, a protection member 8 is placed on the wall member 7, for the purpose of protecting the apparatus from flaws during transportation and making the wall member 7 resistant against a strongly basic solution for anisotropic etching of the silicon substrate 1*a*. Any material can be used to form the protection member 8 as long as the protection member 8 is resistant against etching and can be removed after the liquid supply port 10 is formed. Specific examples of the material of the protection member 8 include cyclized isoprene and other cyclized rubber materials. The solvent used to remove the protection member 8 is xylene or some other organic solvent in which the material of the protection member 8 is soluble.

Figure 4B:
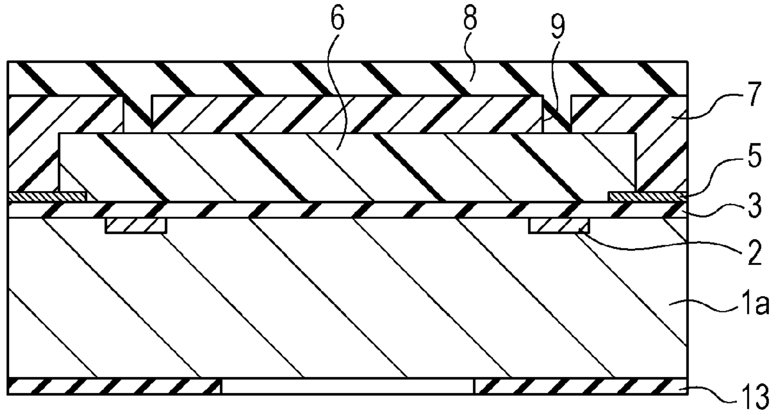

Then, the portion of the silicon oxide layer 11 that corresponds in position to the opening of the etching mask 12 is removed by wet etching using hydrofluoric acid or ammonium fluoride or dry etching based on RIE (reactive ion etching); as a result, a mask layer 13, based on silicon oxide, is left with a portion thereof opened to give the liquid supply port 10. Then, as illustrated in FIG. 4B, the etching mask 12 is removed.

Figure 4C:
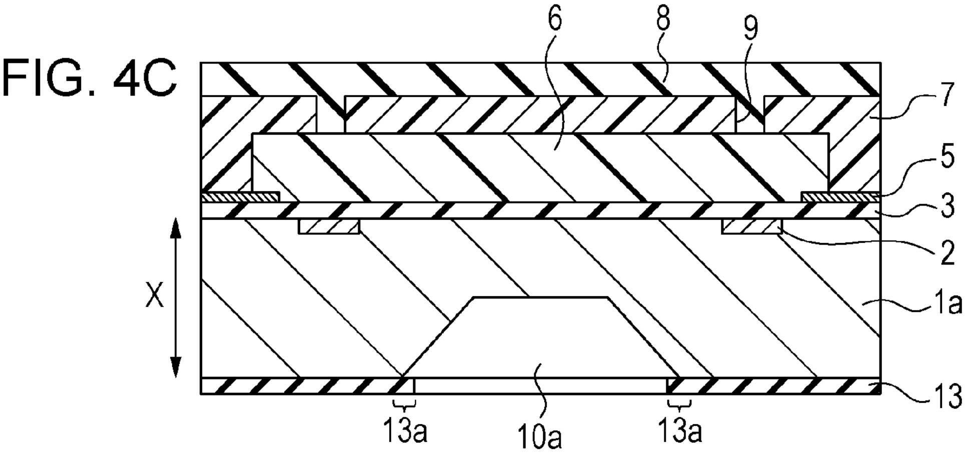

Then, as illustrated in FIG. 4C, the liquid supply port 10 is created in part by etching. This etching step is carried out using a first etchant with the mask layer 13, which has an opening corresponding in position to the liquid supply port 10, as a mask. As a result, a depression 10*a* is left on the second surface of the silicon substrate 1*a* (the first etching step). The first etchant is an etchant that offers a lower etching rate on silicon oxide surfaces than on silicon substrates, namely, an etchant that offers a high $Si/SiO_2$ etching selectivity. Specific examples of the first etchant include TMAH solution, ethylenediamine pyrocatechol water (EPW), sodium hydroxide (NaOH) aqueous solution, and so forth.

Figure 4D:
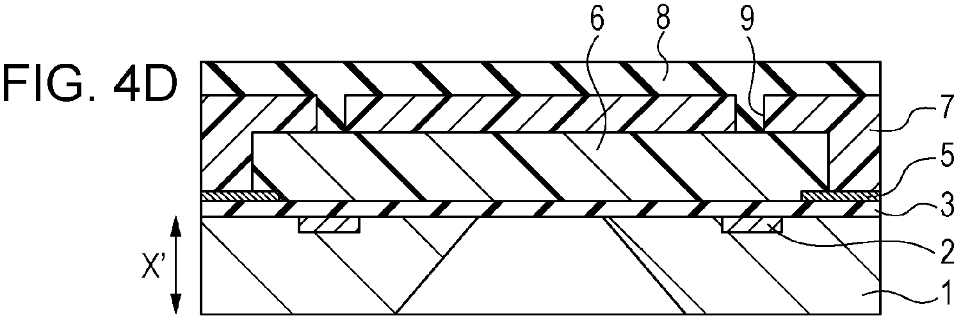
Figure 5A:
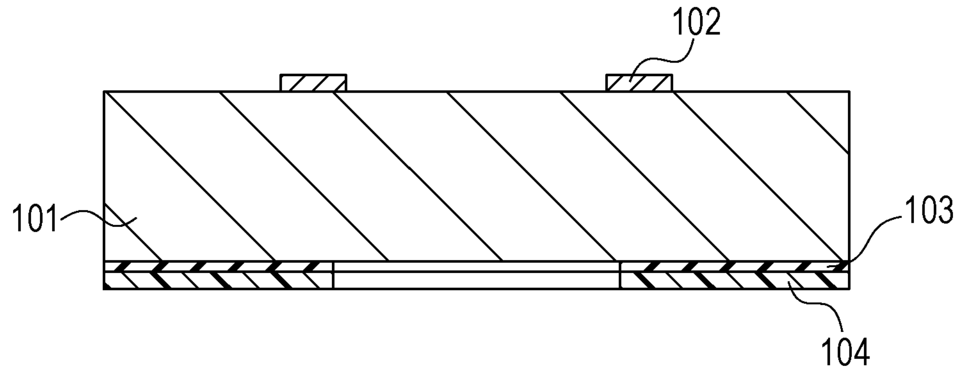
FIGS. 5A to 5C are cross-sectional diagrams illustrating steps in a known method for manufacturing a liquid supply port.
Figure 5B:
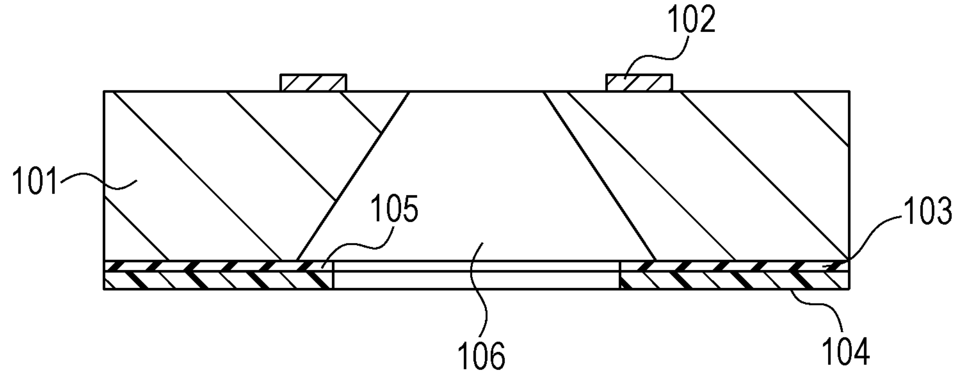
Figure 5C:
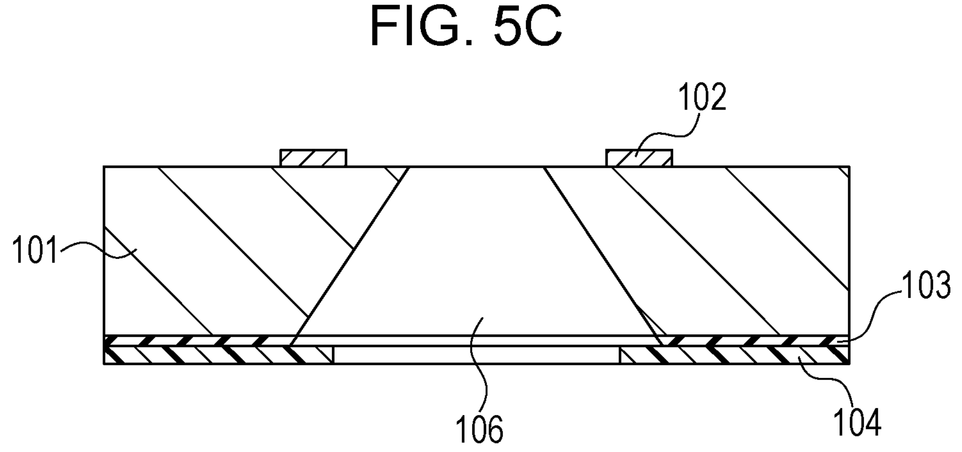

Then, a second etching step is carried out. Here, the etchant used is one that offers a higher etching rate on silicon oxide surfaces than that offered by the first etchant, namely, an etchant that offers a lower $Si/SiO_2$ etching selectivity. This treatment etches the mask layer 13 and the portion sandwiched between the depression 10*a* and the first surface of the silicon substrate 1*a*. As a result, a hole is formed through the silicon substrate 1*a*, providing the liquid supply port 10, as illustrated in FIG. 4D (the second etching step). A specific example of the second etchant is potassium hydroxide (KOH) aqueous solution. The mask layer 13 has a thickness small enough that the second etchant can finish etching the mask layer 13 earlier than it finishes creating the liquid supply port 10; the mask layer 13 is removed during the second etching step. In this step, a burr 13*a*, a portion of the mask layer 13, is also removed. This eliminates the need for a separate step to remove the burr 13*a* and the mask layer 13, in other words, makes it possible to form the liquid supply port 10 and remove the burr 13*a* at the same time, thereby providing a shortened and simplified manufacturing scheme.

As the mask layer 13 is removed while the liquid supply port 10 is being formed, the second surface of the silicon substrate 1*a* is also etched; as a result, the thickness of the silicon substrate 1*a* is decreased from X to X'. Incidentally, several liquid-ejecting heads 41 may be used in combination like the first and second liquid-ejecting heads 41*a* and 41*b* illustrated in FIG. 1B. In such a case, all ejection ports 9 should be in substantially the same distance from the recording medium used; the thickness Y in FIG. 2B should be substantially the same among all liquid-ejecting heads. However, it is impractical to change the thickness of the wall member 7 because this also changes the amount of droplets ejected. Thus, the thickness of the silicon substrate 1*a*, X', is used for adjustment. In the present invention, the durations of the first and second etching steps determine the thickness X'. When several liquid-ejecting heads are used, therefore, the present invention eliminates the need for a separate step for thinning the silicon substrate 1*a*, thereby providing a shortened and simplified manufacturing scheme.

Turning back to the description of the manufacturing method, the next step is the completion of the liquid-ejecting head substrate 42. In this step, the portion of the insulating layer 3 that corresponds in position to the liquid supply port 10 is removed by wet etching or some other appropriate method. Then, the protection member 8 is removed by dissolution in a solvent such as xylene, and the mold 6 is removed by ultraviolet (UV) irradiation of the wall member 7 followed by immersion in methyl lactate; as a result, the liquid supply port 10 communicates via the flow passage 18 with the ejection ports 9.

In this way, a liquid-ejecting head 41 like the one illustrated in FIG. 2B is obtained.

Hereinafter, the first and second etching steps are detailed with reference to examples.

Example 1

In this example, the initial thickness of the silicon substrate 1*a*, X, was 625 μm. The mask layer 13, based on silicon oxide and formed on the second surface of the silicon substrate 1*a*, had a thickness of 0.7 μm. In forming the liquid supply port 10, 22 wt % TMAH solution was used as the first etchant, and 38 wt % KOH aqueous solution was used as the second etchant.

With 22 wt % TMAH solution, the etching rate is about 30 μm/hour on the (100) plane of silicon and about 0.011 μm/hour on a silicon oxide surface, or on the mask layer 13. With 38 wt % KOH aqueous solution, the etching rate is about 90 μm/hour on the (100) plane of silicon and about 1.7 μm/hour on a silicon oxide surface.

First, the first etching step was carried out to create the depression 10*a* as illustrated in FIG. 4C under the following conditions: etchant: TMAH solution; duration of etching: 1030 minutes; depth of the depression 10*a*: approximately 515 μm. Then, TMAH solution was removed by rinsing with purified water. Since TMAH offers a lower etching rate on silicon oxide surfaces than on silicon substrates, this treatment etched the mask layer 13 only to a small extent, with a decrease in thickness as small as 0.19 μm.

Then, the second etching step was carried out for further etching until the first surface of the silicon substrate 1*a* was reached and the liquid supply port 10 was completed as illustrated in FIG. 4D. The etchant used was KOH aqueous solution, and the duration of etching was 75 minutes. This treatment completely removed the mask layer 13 in approximately 18 minutes, and the remaining duration of etching, or approximately 56 minutes, was spent for etching of the silicon substrate 1*a*. The resultant thickness of the silicon substrate 1*a*, X', was approximately 541 μm.

The mask layer 13 was removed by the second etching step, together with the burr 13*a*. This eliminated the need for a separate step to remove the burr 13*a* and the mask layer 13, thereby providing a shortened and simplified manufacturing scheme.

Although the resultant thickness of the silicon substrate 1*a*, X', was approximately 541 μm in this example, it can be controlled by adjustment of the durations of the first and second etching steps. For example, the first etching step lasting for 1200 minutes and the second etching step lasting for 17 minutes makes the resultant thickness of the silicon substrate 1*a*, X', substantially equal to the initial thickness, X.

Example 2

In this example, the initial thickness of the silicon substrate 1*a*, X, was 625 μm. The mask layer 13, based on silicon oxide and formed on the second surface of the silicon substrate 1*a*, had a thickness of 0.7 μm. In forming the liquid supply port 10, EPW (ethylenediamine:pyrocatechol:water=750 mL:120 g:100 mL) was used as the first etchant, and 38 wt % KOH aqueous solution was used as the second etchant.

With EPW formulated as above, the etching rate is about 45 μm/hour on the (100) plane of silicon and about 0.012 μm/hour on a silicon oxide surface, or on the mask layer 13. With 38 wt % KOH aqueous solution, the etching rate is about 90 μm/hour on the (100) plane of silicon and about 1.7 μm/hour on a silicon oxide surface.

First, the first etching step was carried out to create the depression 10*a* as illustrated in FIG. 4C under the following conditions: etchant: EPW; duration of etching: 700 minutes; depth of the depression 10*a*: approximately 525 μm. Then, EPW was removed by rinsing with purified water. Since EPW offers a lower etching rate on silicon oxide surfaces than on silicon substrates, this treatment etched the mask layer 13 only to a small extent, with a decrease in thickness as small as 0.14 μm.

Then, the second etching step was carried out for further etching until the first surface of the silicon substrate 1*a* was reached and the liquid supply port 10 was completed as illustrated in FIG. 4D. The etchant used was KOH aqueous solution, and the duration of etching was 67 minutes. This treatment completely removed the mask layer 13 in approximately 20 minutes, and the remaining duration of etching, or approximately 47 minutes, was spent for etching of the silicon substrate 1*a*. The resultant thickness of the silicon substrate 1*a*, X', was approximately 555 μm.

The mask layer 13 was removed by the second etching step, together with the burr 13*a*. This eliminated the need for a separate step to remove the burr 13*a* and the mask layer 13, thereby providing a shortened and simplified manufacturing scheme.

Although the resultant thickness of the silicon substrate 1*a*, X', was approximately 555 μm in this example, it can be controlled by adjustment of the durations of the first and second etching steps. For example, the first etching step lasting for 796 minutes and the second etching step lasting for 19 minutes makes the resultant thickness of the silicon substrate 1*a*, X', substantially equal to the initial thickness, X.

Example 3

In this example, the initial thickness of the silicon substrate 1*a*, X, was 625 μm. The mask layer 13, based on silicon oxide and formed on the second surface of the silicon substrate 1*a*, had a thickness of 0.7 μm. In forming the liquid supply port 10, 5 mol/L NaOH aqueous solution was used as the first etchant, and 38 wt % KOH aqueous solution was used as the second etchant.

With 5 mol/L NaOH aqueous solution, the etching rate is about 120 μm/hour on the (100) plane of silicon and about 0.048 μm/hour on a silicon oxide surface, or on the mask layer 13. With 38 wt % KOH aqueous solution, the etching rate is about 90 μm/hour on the (100) plane of silicon and about 1.7 μm/hour on a silicon oxide surface.

First, the first etching step was carried out to create the depression 10*a* as illustrated in FIG. 4C under the following conditions: etchant: NaOH aqueous solution; duration of etching: 250 minutes; depth of the depression 10*a*: approximately 500 μm. Then, NaOH aqueous solution was removed by rinsing with purified water. Since NaOH aqueous solution offers a lower etching rate on silicon oxide surfaces than on silicon substrates, this treatment etched the mask layer 13 only to a small extent, with a decrease in thickness as small as 0.2 μm.

Then, the second etching step was carried out for further etching until the first surface of the silicon substrate 1*a* was reached and the liquid supply port 10 was completed as illustrated in FIG. 4D. The etchant used was KOH aqueous solution, and the duration of etching was 84 minutes. This treatment completely removed the mask layer 13 in approximately 18 minutes, and the remaining duration of etching, or approximately 66 minutes, was spent for etching of the silicon substrate 1*a*. The resultant thickness of the silicon substrate 1*a*, X', was approximately 525 μm.

The mask layer 13 was removed by the second etching step, together with the burr 13*a*. This eliminated the need for a separate step to remove the burr 13*a* and the mask layer 13, thereby providing a shortened and simplified manufacturing scheme.

Although the resultant thickness of the silicon substrate 1*a*, X', was approximately 525 μm in this example, it can be controlled by adjustment of the durations of the first and second etching steps. For example, the first etching step lasting for 300 minutes and the second etching step lasting for 17 minutes makes the resultant thickness of the silicon substrate 1*a*, X', substantially equal to the initial thickness, X.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-291022 filed Dec. 22, 2009, which is hereby incorporated by reference herein in its entirety.

What is claimed is:

1. A method for manufacturing a substrate for liquid-ejecting heads comprising:

preparing a silicon substrate to have a first surface and a second surface opposite to the first surface, the second surface covered with a silicon oxide layer having an opening, and an energy-generating element formed at a side of the first surface of the silicon substrate;

etching a portion of the silicon substrate using a first etchant so as to form a depression, on a bottom of which silicon of the silicon substrate is exposed, on the second surface of the silicon substrate, with the silicon oxide layer as a mask, the first etchant offering a lower etching rate on silicon oxide surfaces than on silicon surfaces; and applying a second etchant to the depression, on the bottom of which silicon of the silicon substrate is exposed, so as to etch at least the silicon oxide layer and a portion sandwiched between the depression and the first surface to form a liquid supply port, the second etchant offering a higher etching rate on silicon oxide surfaces than that offered by the first etchant, wherein an insulating layer is formed on the first surface, the insulating layer is not exposed on the bottom when the silicon substrate is exposed on the bottom, the insulating layer is exposed by etching a portion sandwiched between the depression and the first surface with the second etchant, and the insulating layer is removed after the step of etching with the second etchant.

2. The method according to claim 1, wherein:

the first etchant is any one selected from a group including tetramethylammonium hydroxide solution, ethylenediamine pyrocatechol water, and sodium hydroxide aqueous solution.

3. The method according to claim 1, wherein:

the second etchant is potassium hydroxide aqueous solution.

4. The method according to claim 1, wherein:

in etching with the second etchant, the silicon oxide layer is removed, and then the silicon substrate is etched starting with the second surface, so that the silicon substrate is thinned.

5. The method according to claim 1, wherein:

the silicon substrate is equipped with a liquid ejection port.

6. The method according to claim 1, wherein:

the energy-generating element generates energy for ejection of a liquid.

7. The method according to claim 6, wherein:

the liquid supply port supplies the liquid.

8. The method according to claim 1, wherein:

the silicon oxide layer on the second surface is etched and completely removed by applying the second etchant, and after the silicon oxide layer is completely removed, a portion sandwiched between the depression and the first surface is etched and removed, so that a supply port is formed through the silicon substrate.

9. A method for manufacturing a substrate for liquid-ejecting heads comprising:

preparing a silicon substrate to have a first surface and a second surface opposite to the first surface, the second surface covered with a silicon oxide layer having an opening, and an energy-generating element formed at a side of the first surface of the silicon substrate;

etching a portion of the silicon substrate using a first etchant so as to form a depression, on a bottom of which silicon of the silicon substrate is exposed, on the second surface of the silicon substrate, with the silicon oxide layer as a mask, the first etchant offering a lower etching rate on silicon oxide surfaces than on silicon surfaces;

applying a second etchant to the depression, on the bottom of which silicon of the silicon substrate is exposed, so as to etch at least the silicon oxide layer and a portion sandwiched between the depression and the first surface to form the liquid supply port, the second etchant offering a higher etching rate on silicon oxide surfaces than that offered by the first etchant; and forming a wall member having a wall for flow passage that allows the liquid ejection port and the liquid supply port to communicate with each other, such that the wall member comes into contact with the first surface with the wall inside, wherein an insulating layer is formed on the first surface, the insulating layer is not exposed on the bottom when the silicon substrate is exposed on the bottom, the insulating layer is exposed by etching a portion sandwiched between the depression and the first surface with the second etchant, and the insulating layer is removed after the step of etching with the second etchant.

10. The method according to claim 9, wherein:

the silicon substrate is equipped with a liquid ejection port.

11. The method according to claim 9, wherein:

the first etchant is any one selected from a group including tetramethylammonium hydroxide solution, ethylenediamine pyrocatechol water, and sodium hydroxide aqueous solution.

12. The method according to claim 9, wherein:

the second etchant is potassium hydroxide aqueous solution.

13. The method according to claim 9, wherein:

in etching with the second etchant, the silicon oxide layer is removed, and then the silicon substrate is etched starting with the second surface, so that the silicon substrate is thinned.

14. The method according to claim 9, wherein:

the energy-generating element generates energy for ejection of a liquid.

15. The method according to claim 14, wherein:

the liquid supply port supplies the liquid.

16. The method according to claim 9, wherein:

the silicon oxide layer on the second surface is etched and completely removed by applying the second etchant, and after the silicon oxide layer is completely removed, a portion sandwiched between the depression and the first surface is etched and removed, so that a supply port is formed through the silicon substrate.

* * * * *